United States Patent
Kapoor

(10) Patent No.: US 9,614,526 B1
(45) Date of Patent: Apr. 4, 2017

(54) POWER-DOMAIN ASSIGNMENT

(71) Applicant: NXP B.V., Eindhoven (NL)

(72) Inventor: Ajay Kapoor, Eindhoven (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 15/019,384

(22) Filed: Feb. 9, 2016

(51) Int. Cl.
*H03K 19/0175* (2006.01)
*H03K 3/356* (2006.01)
*H03K 3/012* (2006.01)

(52) U.S. Cl.
CPC ..... *H03K 19/017509* (2013.01); *H03K 3/012* (2013.01); *H03K 3/356* (2013.01)

(58) Field of Classification Search
CPC .......... H03K 3/356; H03K 19/018521; H03K 19/00315; H03K 17/102; H03K 3/012
USPC ................. 327/306, 333; 326/60, 61, 80, 81
See application file for complete search history.

(56) References Cited

U.S. PATENT DOCUMENTS

| | | | |
|---|---|---|---|
| 5,867,040 A | 2/1999 | Fuse et al. | |
| 6,479,974 B2 | 11/2002 | Cohn et al. | |
| 6,759,872 B2* | 7/2004 | Lai ................. | H03K 19/018585 326/62 |
| 7,329,968 B2 | 2/2008 | Shepard et al. | |
| 7,984,317 B2* | 7/2011 | Conroy ................. | G06F 1/3203 713/324 |
| 8,200,990 B2* | 6/2012 | Dishman ................... | G06F 1/26 713/300 |
| 8,339,177 B2 | 12/2012 | Jarrar et al. | |
| 8,476,962 B2 | 7/2013 | Pelley | |
| 8,878,387 B1 | 11/2014 | Wong et al. | |
| 8,957,778 B2* | 2/2015 | Adams .................... | B01L 3/545 235/385 |
| 2006/0119390 A1 | 6/2006 | Sutardja | |
| 2010/0259299 A1 | 10/2010 | Dennard et al. | |
| 2013/0154712 A1* | 6/2013 | Hess .............. | H03K 19/018521 327/333 |
| 2014/0340142 A1 | 11/2014 | Wong et al. | |
| 2015/0346742 A1 | 12/2015 | Kapoor et al. | |

OTHER PUBLICATIONS

"A Practical Guide to Low-Power Design"; retrieved from the internet https://www.si2.org/.../PowerForward/LowPowerGuide09232009/.../Ipg on Nov. 18, 2015; 110 pages (Jun. 5, 2009).

(Continued)

Primary Examiner — Dinh T Le

(57) ABSTRACT

Example apparatus for power-domain assignment, having: a first bus-to-switch interface; a second bus-to-switch interface; a first power-domain bus, coupled to the first bus-to-switch interface; a second power-domain bus, coupled to the second bus-to-switch interface. A set of I/O signal level shifters, coupled between the first and second power-domain buses; a switch including, a set of IP block power coupling outputs; a set of IP block I/O signal paths; and a selection signal input. The switch is coupled to the first and second bus-to-switch interfaces. Wherein, in response to receiving a first signal on the selection signal input, the switch is configure to couple the first power-domain bus to the set of IP block power coupling outputs; and wherein, in response to receiving a second signal on the selection signal input, the switch is configure to couple the second power-domain bus to the set of IP block power coupling outputs.

12 Claims, 7 Drawing Sheets

(56) References Cited

OTHER PUBLICATIONS

"Lecture 13—Digital Circuits (III), CMOS Circuits"; 17 pages; Spring 2007.

Andersen, Toke M. et al; "A 4.6 W/mm2 Power Density 86% Efficiency On-Chip Switched Capacitor DC-DC Converter in 32 nm SOI CMOS"; Twenty-Eighth Annual IEEE Applied Power Electronics Conference and Exposition, Long Beach, CA, USA; pp. 692-699 (Mar. 2013).

Hwang, Sanghoon et al; "Velocity Saturation Effects in a Short Channel Si-MOSFET and its Small Signal Characteristics"; Journal of the Korean Physical Society, vol. 55, No. 2; pp. 581-584 (Aug. 2009).

Lee, Sae Kyu et al; "A 16-core voltage-stacked system with an integrated switched-capacitor DC-DC converter"; 2015 Symposium on VLSI Circuits Digest of Technical Papers; 2 pages (2015).

Lee, Sae Kyu et al; "Evaluation of Voltage Stacking for Near-Threshold Multicore Computing"; ISLPED' 12, Redondo Beach, CA, USA, pp. 373-378 (Aug. 2012).

Liu, Yong et al; "A 0.1pJ/b 5-to-10Gb/s Charge-Recycling Stacked Low-Power I/O for On-Chip Signaling in 45nm CMOS SOI"; IEEE ISSCC 2013/Session 23/Short-Reach Links, XCVR Techniques, & PLLS; pp. 400-402 (Feb. 20, 2013).

NXP, B.V., Kapoor, A.; "Configurable Power Domain and Method"; U.S. Appl. No. 14/794,485, filed Jul. 8, 2015; 32 Pages.

NXP, B.V.; Blutman, K.L. et al; U.S. Appl. No. 14/804,411, filed Jul. 8, 2015, "Level Shifter and Approach Therefor"; 33 Pages.

NXP, B.V.; Kapoor, Ajay; "Power-Domain Current Balance"; U.S. Appl. No. 14/973,575; 31 pages (Dec. 17, 2015).

Rajapandian, Saravanan et al; "High-Voltage Power Delivery Through Charge Recycling"; IEEE Journal of Solid-State Circuits, vol. 41, No. 6; pp. 1400-1010 (Jun. 2006).

Schaef, Christopher et al; "Efficient Voltage Regulation for Microprocessor Cores Stacked in Vertical Voltage Domains"; IEEE Transactions on Power Electronics, vol. 31, No. 2; pp. 1795-1808 (Feb. 2016).

Ueda, Kazuhiro et al; "Low-Power On-Chip Charge-Recycling DC-DC Conversion Circuit and System"; IEEE Journal of Solid-State Circuits, vol. 48, No. 11; pp. 2608-2617; (Nov. 2013).

NXP, B.V.; Kapoor, Ajay; "Power-Domain Optimization"; U.S. Appl. No. 14/973,616; 41 pages (Dec. 17, 2015).

* cited by examiner

POWER-DOMAIN ASSIGNMENT

The present specification relates to systems, methods, apparatuses, devices, articles of manufacture and instructions for power-domain assignment.

SUMMARY

According to an example embodiment, an apparatus for power-domain assignment, comprising: a first bus-to-switch interface; a second bus-to-switch interface; a first power-domain bus, coupled to the first bus-to-switch interface; a second power-domain bus, coupled to the second bus-to-switch interface; a set of I/O signal level shifters, coupled between the first and second power-domain buses; a switch including, a set of IP block power coupling outputs; a set of IP block I/O signal paths; and a selection signal input; wherein the switch is coupled to the first and second bus-to-switch interfaces; wherein, in response to receiving a first signal on the selection signal input, the switch is configured to couple the first power-domain bus to the set of IP block power coupling outputs; and wherein, in response to receiving a second signal on the selection signal input, the switch is configured to couple the second power-domain bus to the set of IP block power coupling outputs.

In another example embodiment, the first and second power-domain buses are stacked.

In another example embodiment, the stacked domain buses are configured for charge recycling.

In another example embodiment, an IP block coupled to the first and second power coupling outputs, and coupled to the set of IP block I/O signal paths.

In another example embodiment, the first bus-to-switch interface includes, a first IP block power interface and a first IP block I/O signal interface; and wherein the second bus-to-switch interface includes, a second IP block power interface and a second IP block I/O signal interface.

In another example embodiment, the set of IP block power coupling outputs include, a first IP block power coupling output; and a second IP block power coupling output.

In another example embodiment, the first power-domain bus, includes a first set of power inputs and a first I/O level shifter interface; the second power-domain bus, includes a second set of power inputs and a second I/O level shifter interface; the set of I/O signal level shifters is coupled between the first and second I/O level shifter interfaces.

In another example embodiment, in response to receiving the first signal on the selection signal input, the switch is configured to, couple the first set of power inputs from the first power-domain bus to the first and second IP block power coupling outputs; and couple the first I/O level shifter interface to the set of IP block I/O signal paths.

In another example embodiment, in response to receiving the second signal on the selection signal input, the switch is configured to, couple the second set of power inputs from the second power-domain bus to the first and second IP block power coupling outputs; and couple the second I/O level shifter interface to the set of IP block I/O signal paths.

In another example embodiment, the apparatus is embodied in an integrated circuit.

In another example embodiment, the first power-domain bus is configured to interface with only memory circuits and the second power-domain bus is configured to interface with only logic circuits.

According to an example embodiment, a method for power-domain assignment in an apparatus: the apparatus includes: a first bus-to-switch interface; a second bus-to-switch interface; a first power-domain bus, coupled to the first bus-to-switch interface; a second power-domain bus, coupled to the second bus-to-switch interface 304; a set of I/O signal level shifters, coupled between the first and second power-domain buses; a switch including, a set of IP block power coupling outputs; a set of IP block I/O signal paths; and a selection signal input; the switch is coupled to the first and second bus-to-switch interfaces; and the method includes: coupling the first power-domain bus to the set of IP block power coupling outputs with the switch, in response to receiving a first signal on the selection signal input; and coupling the second power-domain bus to the set of IP block power coupling outputs with the switch, in response to receiving a second signal on the selection signal input.

The above discussion is not intended to represent every example embodiment or every implementation within the scope of the current or future Claim sets. The Figures and Detailed Description that follow also exemplify various example embodiments.

Various example embodiments may be more completely understood in consideration of the following Detailed Description in connection with the accompanying Drawings, in which:

Figure 1A:
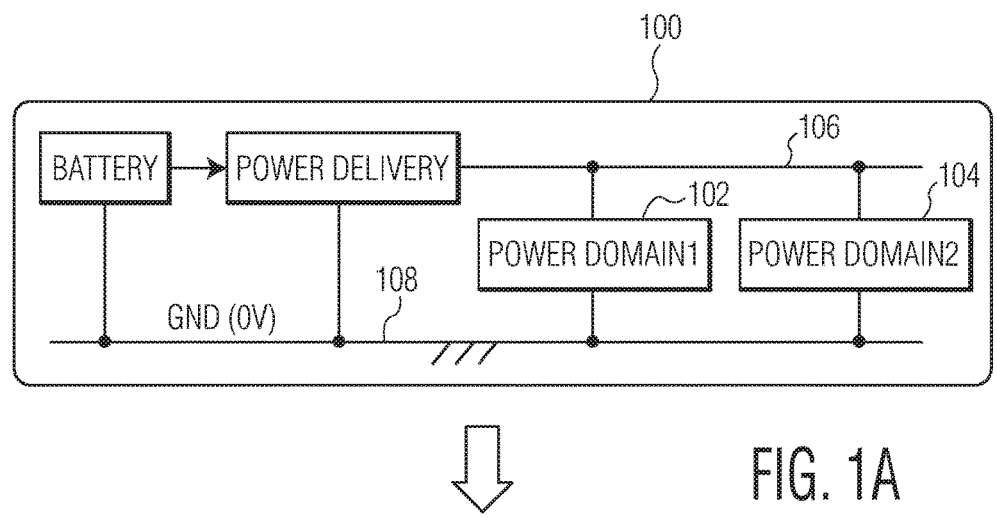
FIG. 1A shows an example set of power-domains in a flat architecture.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

DETAILED DESCRIPTION

SOC (System on a Chip) charge recycling using stacked domains is a design architecture for minimizing power consumption.

For example, FIG. 1A shows an example set of power-domains in a flat architecture 100. A flat architecture 100 is herein defined to include power-domains which share a same voltage from a power-source, such as a battery. This example shows a first power-domain 102, a second power-domain 104, a first voltage rail 106 and a second voltage rail 108. This is a flat architecture since both power-domains 102, 104 are all directly connected to the same voltage rails 106, 108. Such a flat architecture 100 typically consumes more power than a stacked set of power-domains. Note that the flat architecture 100 discussed in FIG. 1A can be extended to a Multi-Supply Voltage (MSV) design, where GND is common but different power-domains can have different power-supply levels (e.g, 0.7V and 1.1V). Such a MSV extension can be applied to all of the drawings discussed herein as well (i.e FIGS. 1B through 6).

Figure 1B:
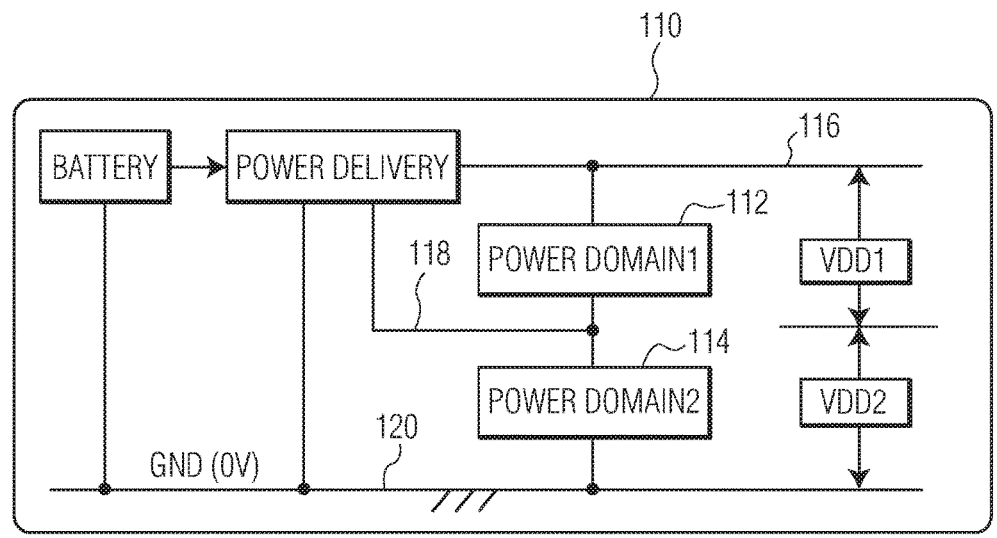
FIG. 1B shows an example set of power-domains in a stacked architecture.

However, FIG. 1B shows an example set of power-domains in a stacked architecture 110. A stacked architecture 110 is herein defined to include power-domains which share a same current from a power-source. This example shows a first power-domain 112, a second power-domain 114, a first voltage rail 116, a second voltage rail 118 and a third voltage rail 120. This is a stacked architecture since the power-domains 112, 114 are not all directly connected to the same voltage rails 116, 118, 120 as shown. Such a stacked architecture 110 typically consumes less power than a flat set of power-domains.

For power-domains that must communicate with each other, such memory and logic, level shifters are required to communicate between the memory and logic domains.

Figure 2A:
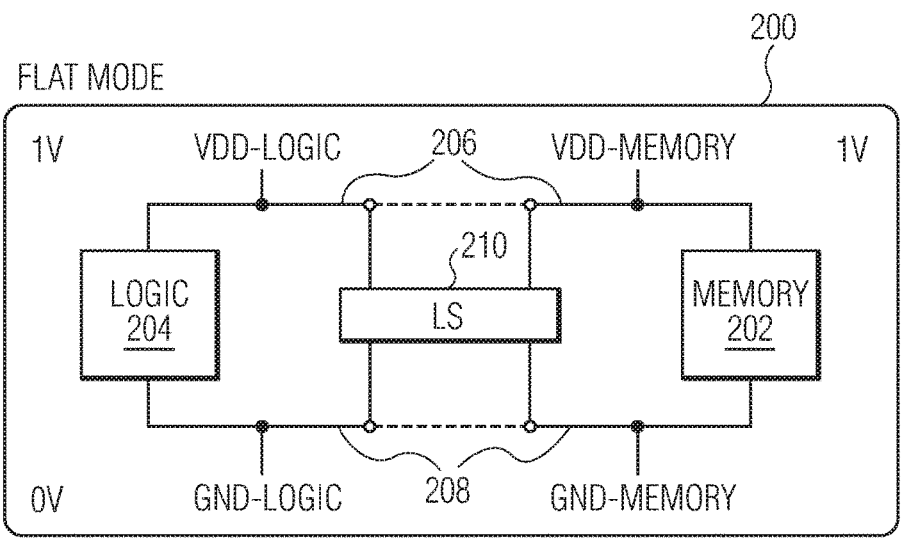
FIG. 2A shows an example set of memory and logic power-domains connected in a flat architecture.

For example, FIG. 2A shows an example set of memory and logic power-domains connected in a flat architecture 200. This architecture 200 includes a memory power-domain 202, a logic power-domain 204, a first voltage rail 206 (e.g. at 1V), as second voltage rail 208 (e.g. at 0V) and a set of I/O (i.e. input/output) signal level shifters 210 as interface between 204 and 202. Again, such a flat architecture 200 typically consumes more power than a stacked set of power-domains.

Figure 2B:
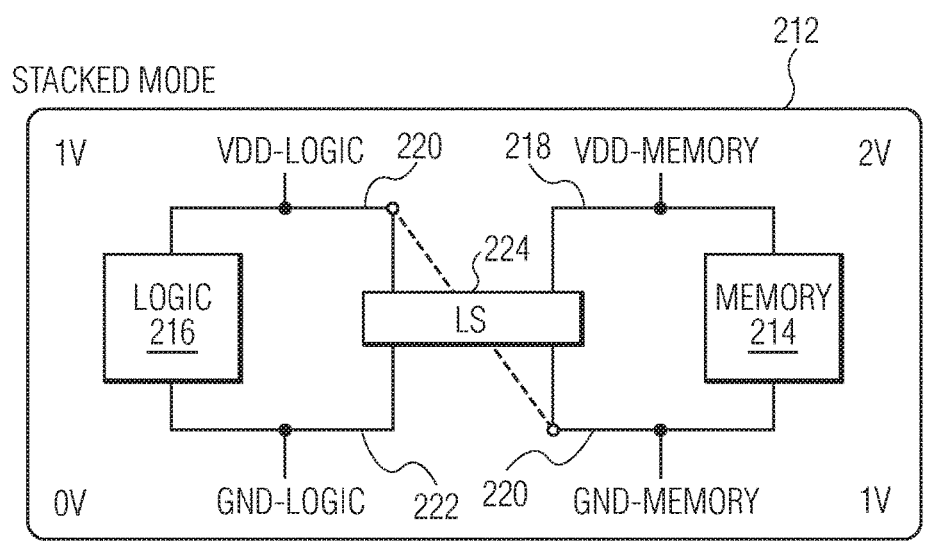
FIG. 2B shows a first example set of memory and logic power-domains connected in a stacked, memory of top of logic (MoTL), architecture.

FIG. 2B shows a first example set of memory and logic power-domains connected in a stacked, memory of top of logic (MoTL), architecture 212. The stacked architecture 212 includes a memory power-domain 214, a logic power-domain 216, a first voltage rail 218 (e.g. at 2V), a second voltage rail 220 (e.g. at 1V), a third voltage rail 222 (e.g. at 0V) and a set of I/O signal level shifters 224. As before, such a stacked architecture 212 typically consumes less power than a flat set of power-domains.

Figure 2C:
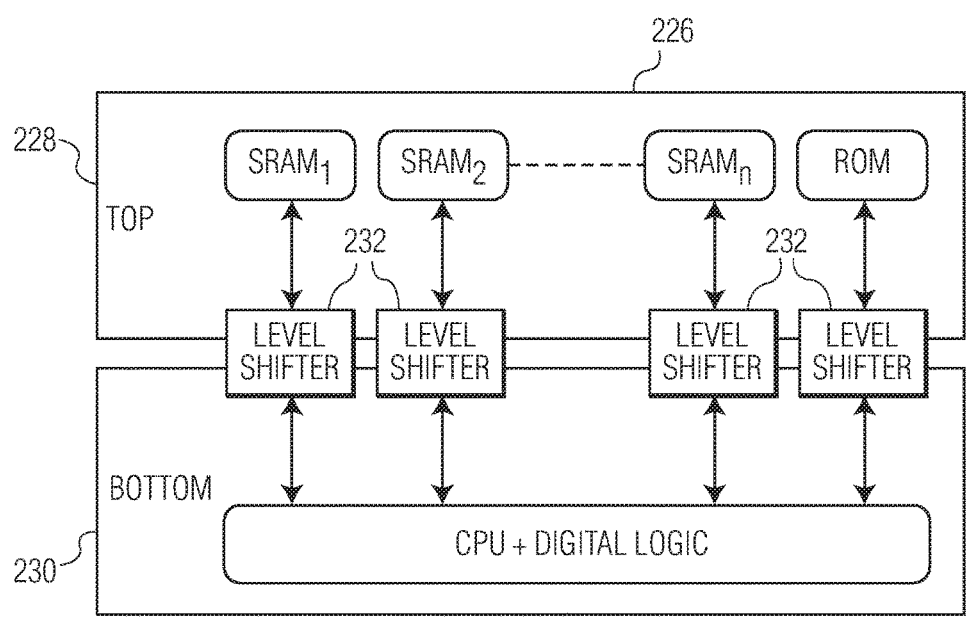
FIG. 2C shows a second example set of memory and logic power-domains connected in a stacked, memory of top of logic (MoTL), architecture.

FIG. 2C shows a second example set of memory and logic power-domains connected in a stacked, memory of top of logic (MoTL), architecture 226. In this example, a top power-domain 228 includes a set of SRAM memories and a bottom power-domain 230 includes a CPU plus digital logic. A set of I/O signal level shifters 232 enable the two power-domains 228, 230 to communicate.

While the stacked architectures 212, 226 in FIGS. 2B and 2C typically consume less power, they include a dedicated set of level shifters and fixed voltage rails to connect various IP blocks (e.g. memory and logic). Such fixed/rigid level shifter and voltage rail assignments may not always scale well as the number of IP blocks and/or power-domains increases.

Such stacked architectures 212, 226 however may include a significant amount of silicon area and power overhead. Such architectures 212, 226 may also not be as scalable since a fixed amount of stacking is deployed which might not be optimal to support different applications and/or use-cases. The fixed set of dedicated "level shifter" links between each power-domain also requires greater chip area, power consumption and control overhead.

Now discussed is an example set of power-domains in a bus-based architecture that can place a set of power-domains in either a flat or stacked configuration.

Figure 3:
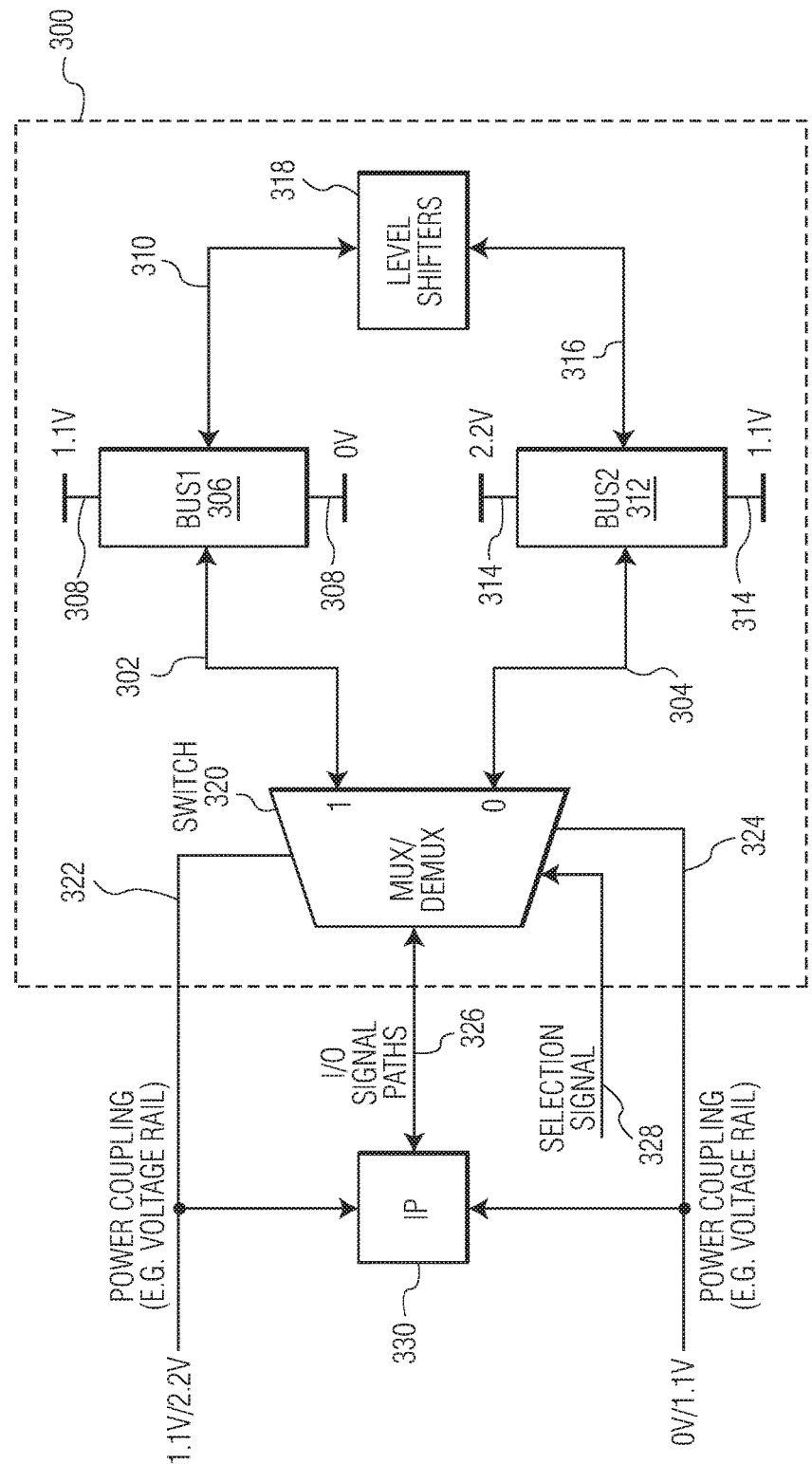
FIG. 3 is an example apparatus for power-domain assignment.

FIG. 3 is an example apparatus for power-domain assignment 300 using a bus-based architecture. The apparatus 300 includes a first bus-to-switch interface 302 which itself includes an IP block power interface (not separately shown) and an IP block I/O signal interface (not separately shown). A second bus-to-switch interface 304 within the apparatus 300 also itself includes an IP block power interface (not separately shown) and an IP block I/O signal interface (not separately shown).

The apparatus 300 has a first power-domain bus 306 coupled to the first bus-to-switch interface 302. The first power-domain bus 306 includes a set of power inputs 308 and an I/O level shifter interface 310, as shown.

The apparatus 300 also has a second power-domain bus 312 coupled to the second bus-to-switch interface 304. The second power-domain bus 312 includes a set of power inputs 314 and an I/O level shifter interface 316. While only two buses 306, 312 are shown, other example embodiments may have any number of buses.

A set of I/O signal level shifters 318 are coupled between the first and second I/O level shifter interfaces 310, 316. In one example the level shifters and their control logic are merged.

A switch 320 (e.g. a multiplexer(MUX) and/or demultiplexer(Demux)) includes a first IP block power coupling output 322, a second IP block power coupling output 324, a set of IP block I/O signal paths 326, and a selection signal input 328. The switch 320 is coupled to the first and second bus-to-switch interfaces 302, 304. In some examples the switch's 320 multiplexer logic can be merged with logic controlling the level shifters 318.

For clarity, example IP block 330 is shown coupled to the first and second power coupling outputs 322, 324 and to the set of IP block I/O signal paths 326.

An IP block 330 is herein defined to at least include circuits, memories, logic, microprocessors, computer controlled software configured modules, and any other electrical component, device, circuit board, AHB (Advanced Microcontroller Bus), etc. In some example embodiments, the IP block might itself be another communications bus.

In FIG. 3, "1.1V/2.2V" is shown next to the first IP block power coupling output 322 and "0V/1.1V" is shown next to the second IP block power coupling output 324 to indicate the various bus power inputs 308, 314 voltage values that can be applied to the IP block 330 by the switch 320. The IP block power interface within the first and second bus-to-switch interfaces 302, 304 carry signals within these voltage rails.

Similarly, the switch 320 routes the IP block I/O signal interface within the first and second bus-to-switch interfaces 302, 304 to the IP block 330 through the set of IP block I/O signal paths 326.

Figure 6:
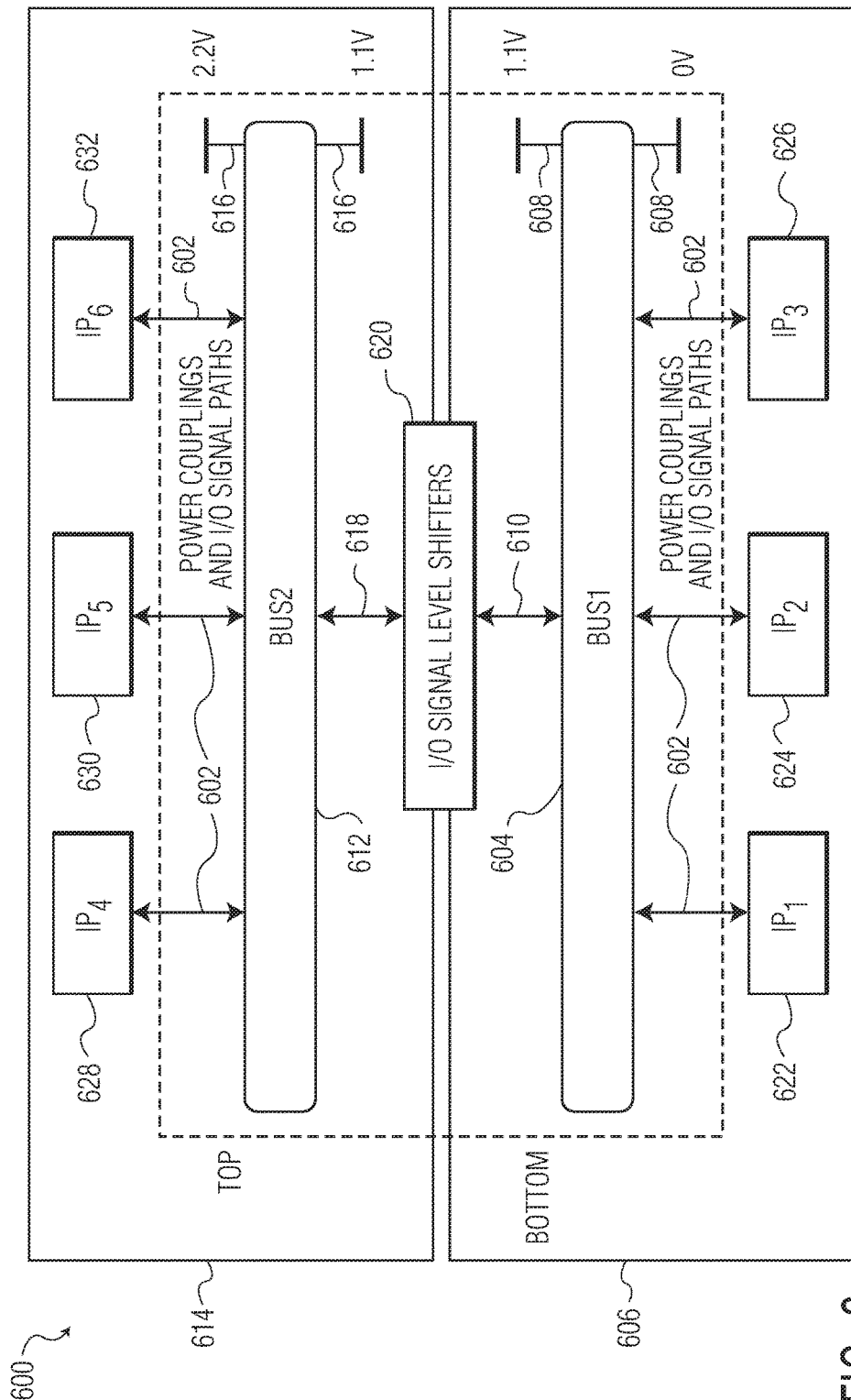
FIG. 6 is an example set of power-domain assignments using another example embodiment of the apparatus for power-domain assignment.

Due to the responsiveness of the switch 320 to the selection signal input 328, this apparatus 300 enables a very scalable system architecture for charge recycling or load balancing for a multitude of applications and use-cases For example, selection signals on the selection signal input 328 can create power-domain stacking at a much finer level and can more readily move a set of IP blocks between power-domains resulting in finer control of load balancing between the set of power-domains, as will later be shown in FIG. 6. In one embodiment, 328 can be connected to the 1V permanently. This allows automatic selection of bus1 or bus2 based on the voltage assignment on 322 and 324.

Since in some examples only bus-to-bus level shifters are required, some example embodiments of the apparatus 300 will require less chip area, power consumption and control overhead as compared fixed and dedicated level shifter and voltage rail architectures, discussed in the earlier Figures.

For example, for a 32-bit bus only a fixed amount "n" of level shifters are required using the apparatus 300. In contrast, fixed/dedicated architectures typically require that each IP block, for example, "m" blocks, have its own set of level shifters, which upon scaling will be on the order "m*n". Thus the apparatus 300 replaces prior point-to-point based IP block connections with a smaller MUX and bus set of connections, resulting in a reduction in a total number of level shifters required as compared with fixed and dedicated designs. Use of this bus architecture discussed herein also typically has a lower power overhead and faster response time than a non-bus design due to the reduced use of level-shifting logic.

Figure 4:
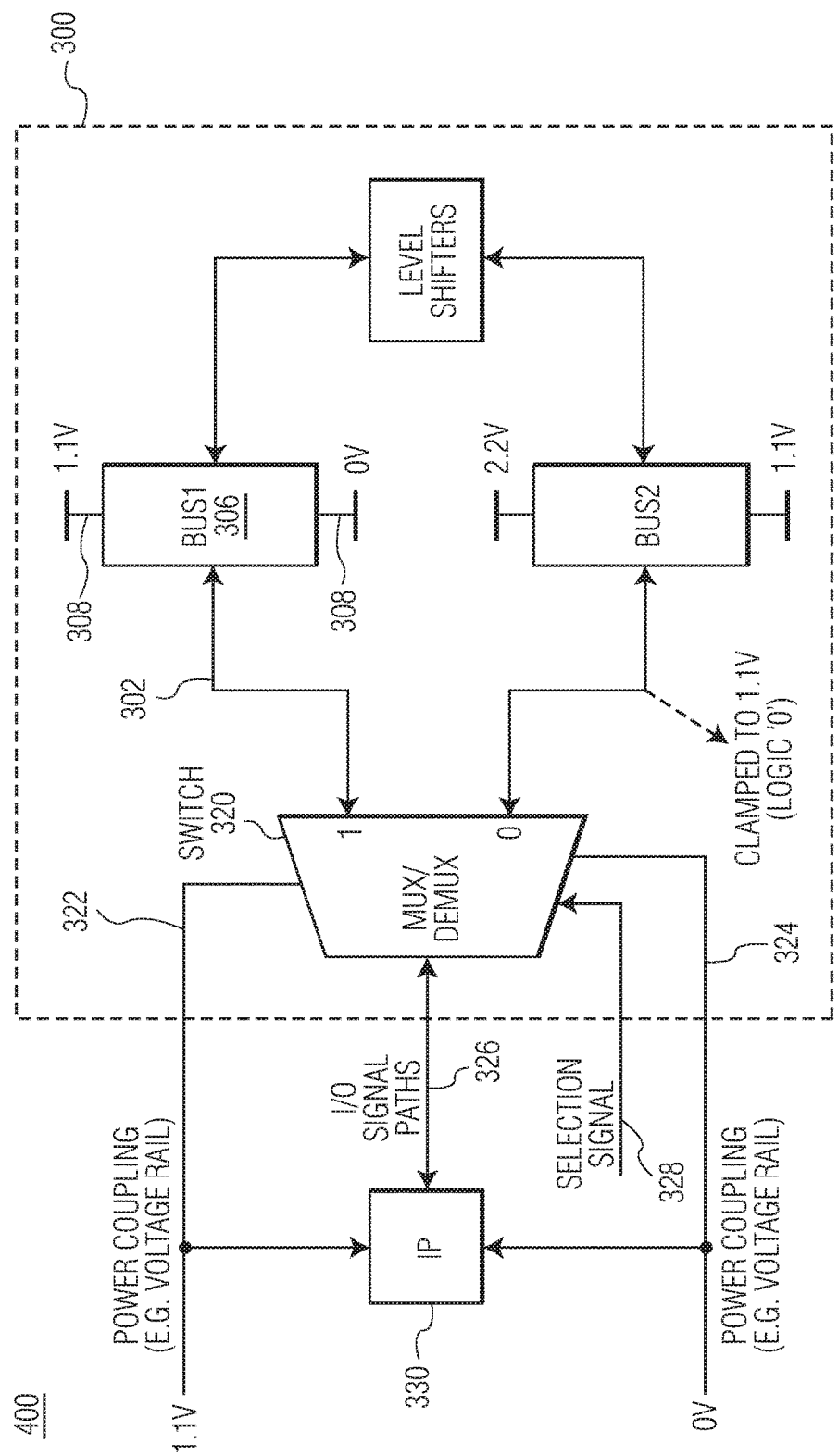
FIG. 4 is a first example power-domain assignment using the example apparatus for power-domain assignment.

FIG. 4 is a first example power-domain assignment 400 using the example apparatus for power-domain assignment 300. Here a selection signal (which is a tie-off to the 1.1V as explained earlier) on the selection signal input 328 connects the first power-domain bus 306 to the IP block 330. See the "1.1V" shown next to the first IP block power coupling output 322 and "0V" shown next to the second IP block power coupling output 324 to indicate that the first power-domain bus 306 has been selected.

Figure 5:
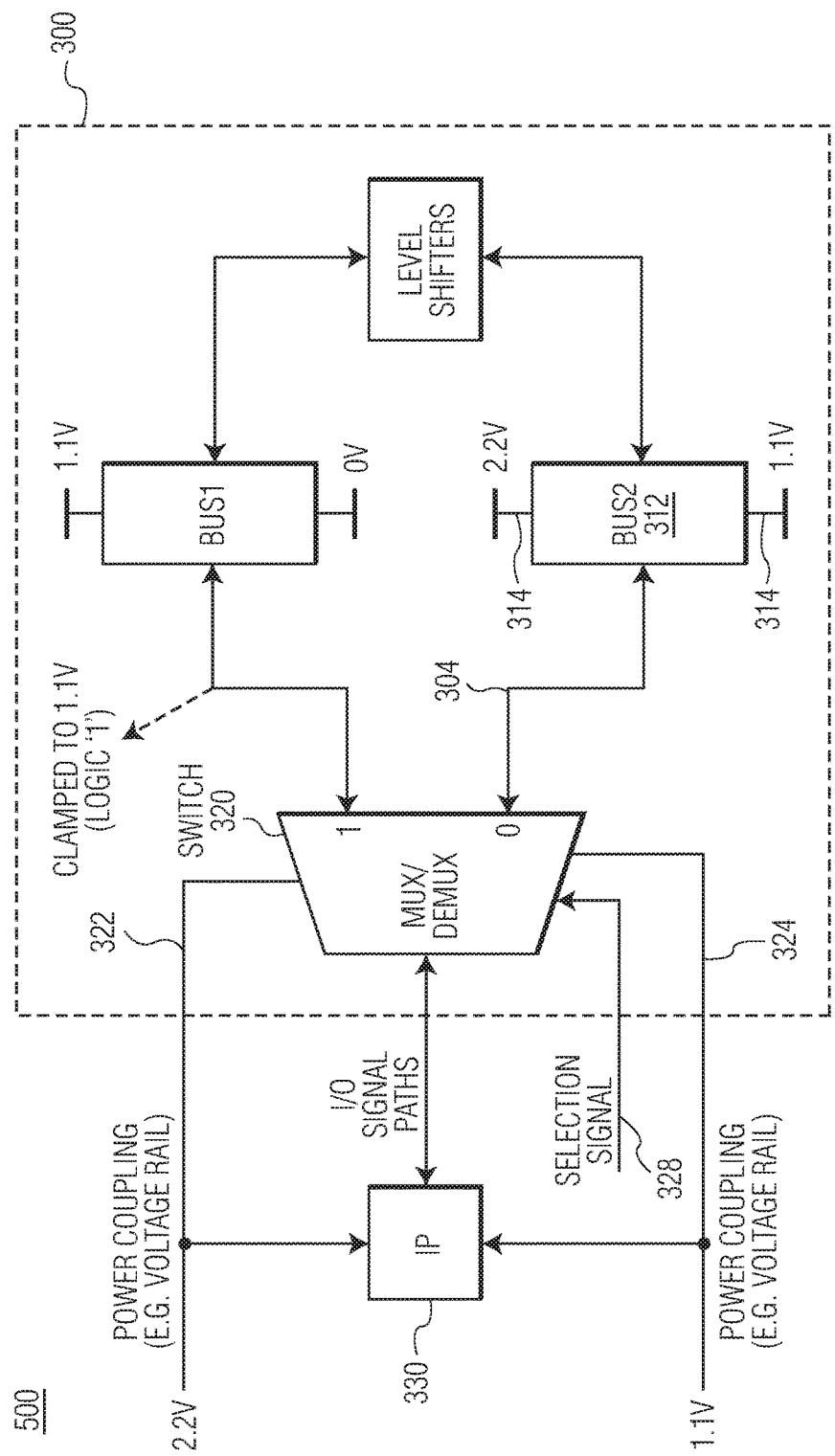
FIG. 5 is a second example power-domain assignment using the example apparatus for power-domain assignment.

FIG. 5 is a second example power-domain assignment 500 using the example apparatus for power-domain assignment 300. Here a selection signal (which is a tie-off to the 1.1V as explained earlier) on the selection signal input 328 connects the second power-domain bus 312 to the IP block 330. See the "2.2V" shown next to the first IP block power coupling output 322 and "1.1V" shown next to the second IP block power coupling output 324 to indicate that the second power-domain bus 312 has been selected.

The example voltage levels in FIG. 4 and FIG. 5 correspond to 40 nm technology.

FIG. 6 is an example set of power-domain assignments 600 using another example embodiment of the apparatus for power-domain assignment 300. This example set of power-domain assignments 600 shows a set of bus-to-switch interfaces 602, a first power-domain bus 604, a second power-domain bus 612, a set of I/O signal level shifters 620, and set of IP blocks 622, 624, 626, 628, 630, 632.

The set of bus-to-switch interfaces 602 include switches each having an IP block power interface, an IP block I/O signal interface, a set of IP block power coupling outputs, a set of IP block I/O signal paths, and a set of selection signal inputs similar to those shown in FIG. 3.

The first power-domain bus 604, shown in a bottom power-domain 606, includes a set of power inputs 608, and a set of I/O level shifter interfaces 610 (e.g. 32-bit data bus each having a level shifter interface). The first power-domain bus 604 is coupled to the set of bus-to-switch interfaces 602.

The second power-domain bus 612, shown in a top power-domain 614, includes a set of power inputs 616, and a set of I/O level shifter interfaces 618. The second power-domain bus 612 is coupled to the set of bus-to-switch interfaces 602.

The set of I/O signal level shifters 620 is coupled between the first and second I/O level shifter interfaces 610, 618.

Individual IP blocks, in the set of IP blocks 622, 624, 626, 628, 630, 632, are coupled to a subset of bus-to-switch interfaces 602 based on the switch configuration, of FIGS. 3, 4 and 5, in response to select signals on the selection signal inputs to the switch.

As shown in FIG. 6, the IP blocks 622, 624, 626, 628, 630, 632 are switchable between the top to bottom power-domains 606, 614 in response to one or more domain select signals (not shown). In response to these domain select signals, one or more switches (not shown in FIG. 6, but part of the set of bus-to-switch interfaces 602) connect each IP block's voltage rails to the voltage rails of either the top or bottom power-domain (i.e. the first and second set of power inputs 608, 616). The switches also connect the IP block's input and output (I/O) signals to either the top or bottom power-domain 606, 614.

At least one advantage of such a design is straightforward scalability, in that various IP Blocks can be reconfigured to different power-domain stacks. As a further example, the set of power-domain assignments 600 can be reallocated for example IP1, IP2, IP3, IP4 are in top domain and IP5, IP6 are in bottom. Moreover, amount of level-shift logic is limited and fixed. This architecture and apparatus can be extended for multiple level of stacking.

In one example, one or more instructions or steps discussed herein are automated. The terms automated or automatically (and like variations thereof) mean controlled operation of an apparatus, system, and/or process using computers and/or mechanical/electrical devices without the necessity of human intervention, observation, effort and/or decision. The decision intelligence will be based on the use-cases, duration and PVT conditions of operation.

In this specification, example embodiments have been presented in terms of a selected set of details. However, a person of ordinary skill in the art would understand that many other example embodiments may be practiced which include a different selected set of these details. It is intended that the following claims cover all possible example embodiments.

What is claimed is:

1. An apparatus for power-domain assignment, comprising:
   a first bus-to-switch interface;
   a second bus-to-switch interface;
   a first power-domain bus, coupled to the first bus-to-switch interface;
   a second power-domain bus, coupled to the second bus-to-switch interface;
   a set of I/O signal level shifters, coupled between the first and second power-domain buses;
   a switch including,
      a set of IP block power coupling outputs;
      a set of IP block I/O signal paths; and
      a selection signal input;
   wherein the switch is coupled to the first and second bus-to-switch interfaces;
   wherein, in response to receiving a first signal on the selection signal input, the switch is configured to couple the first power-domain bus to the set of IP block power coupling outputs; and
   wherein in response to receiving a second signal on the selection signal input, the switch is configured to couple the second power-domain bus to the set of IP block power coupling outputs.

2. The apparatus of claim 1:
   wherein the first and second power-domain buses are stacked.

3. The apparatus of claim 2:
   wherein the stacked domain buses are configured for charge recycling.

4. The apparatus of claim 1, further comprising:
   an IP block coupled to the first and second power coupling outputs, and coupled to the set of IP block I/O signal paths.

5. The apparatus of claim 1:
wherein the first bus-to-switch interface includes,
   a first IP block power interface and
   a first IP block I/O signal interface; and
wherein the second bus-to-switch interface includes,
   a second IP block power interface and
   a second IP block I/O signal interface.

6. The apparatus of claim 1:
wherein the set of IP block power coupling outputs include,
   a first IP block power coupling output; and
   a second IP block power coupling output.

7. The apparatus of claim 6:
wherein the first power-domain bus,
   includes a first set of power inputs and
   a first I/O level shifter interface,
wherein the second power-domain bus,
   includes a second set of power inputs and
   a second I/O level shifter interface,
wherein the set of I/O signal level shifters is coupled between the first and second I/O level shifter interfaces.

8. The apparatus of claim 7:
wherein, in response to receiving the first signal on the selection signal input, the switch is configured to,
   couple the first set of power inputs from the first power-domain bus to the first and second IP block power coupling outputs; and
   couple the first I/O level shifter interface to the set of IP block I/O signal paths.

9. The apparatus of claim 7:
wherein, in response to receiving the second signal on the selection signal input, the switch is configured to,
   couple the second set of power inputs from the second power-domain bus to the first and second IP block power coupling outputs; and
   couple the second I/O level shifter interface to the set of IP block I/O signal paths.

10. The apparatus of claim 1:
wherein the apparatus is embodied in an integrated circuit.

11. The apparatus of claim 1:
wherein the first power-domain bus is configured to interface with only memory circuits and the second power-domain bus is configured to interface with only logic circuits.

12. A method for power-domain assignment in an apparatus:
wherein the apparatus includes:
   a first bus-to-switch interface;
   a second bus-to-switch interface;
   a first power-domain bus, coupled to the first bus-to-switch interface;
   a second power-domain bus, coupled to the second bus-to-switch interface 304;
   a set of I/O signal level shifters, coupled between the first and second power-domain buses;
   a switch including,
     a set of IP block power coupling outputs;
     a set of IP block I/O signal paths; and
     a selection signal input;
   wherein the switch is coupled to the first and second bus-to-switch interfaces; and
wherein the method includes:
   coupling the first power-domain bus to the set of IP block power coupling outputs with the switch, in response to receiving a first signal on the selection signal input; and
   coupling the second power-domain bus to the set of IP block power coupling outputs with the switch, in response to receiving a second signal on the selection signal input.

\* \* \* \* \*